(12) United States Patent
Doris et al.

(10) Patent No.: US 6,780,694 B2
(45) Date of Patent: Aug. 24, 2004

(54) MOS TRANSISTOR

(75) Inventors: Bruce B. Doris, Brewster, NY (US); Omer H. Dokumaci, Wappingers Falls, NY (US); Jack A. Mandelman, Flat Rock, NC (US); Carl J. Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 31 days.

(21) Appl. No.: 10/338,930

(22) Filed: Jan. 8, 2003

(65) Prior Publication Data

US 2004/0132236 A1 Jul. 8, 2004

(51) Int. Cl.$^7$ ............................................. H01L 21/338
(52) U.S. Cl. ........................ 438/182; 438/167; 438/197; 438/574; 438/579; 438/302; 438/303; 438/525; 438/666; 257/133; 257/134; 257/282; 257/283; 257/350
(58) Field of Search ................................. 438/167, 182, 438/186, 197, 574, 579, 302–303, 525, 527, 531, 307, 666

(56) References Cited

U.S. PATENT DOCUMENTS

| | | | |
|---|---|---|---|
| 4,417,385 A | * 11/1983 | Temple ........................ 438/138 |
| 4,679,311 A | 7/1987 | Lakhani et al. |
| 5,559,049 A | 9/1996 | Cho |
| 6,107,667 A | 8/2000 | An et al. |
| 6,159,781 A | 12/2000 | Pan et al. |
| 6,180,501 B1 | * 1/2001 | Pey et al. .................... 438/592 |
| 6,197,645 B1 | * 3/2001 | Michael et al. ............. 438/300 |
| 6,239,007 B1 | 5/2001 | Wu |
| 6,270,929 B1 | 8/2001 | Lyons et al. |
| 6,284,613 B1 | 9/2001 | Subrahmanyam et al. |
| 6,309,933 B1 | 10/2001 | Li et al. |
| 6,319,802 B1 | * 11/2001 | Subramanian et al. ....... 438/585 |
| 6,326,290 B1 | 12/2001 | Chiu |
| 6,417,084 B1 | * 7/2002 | Singh et al. ................. 438/585 |
| 6,440,830 B1 | * 8/2002 | Lopatin ....................... 438/592 |
| 6,509,221 B1 | * 1/2003 | Doris et al. .................. 438/199 |
| 6,534,351 B2 | * 3/2003 | Muller et al. ................ 438/182 |
| 6,613,623 B1 | * 9/2003 | Tsai et al. .................... 438/197 |
| 6,656,824 B1 | * 12/2003 | Hanafi et al. ................ 438/585 |
| 2002/0076874 A1 | * 6/2002 | Coolbaugh et al. .......... 438/202 |
| 2003/0119233 A1 | * 6/2003 | Koganei ...................... 438/182 |
| 2003/0143791 A1 | * 7/2003 | Cheong et al. .............. 438/197 |

FOREIGN PATENT DOCUMENTS

JP 03-163833 * 11/1989 ......... H01L/21/338

* cited by examiner

*Primary Examiner*—Matthew Smith
*Assistant Examiner*—Granvill D. Lee, Jr.
(74) *Attorney, Agent, or Firm*—Graham S. Jones; H. Daniel Schnurmann

(57) ABSTRACT

A method of fabricating a semiconductor transistor device comprises the steps as follows. Provide a semiconductor substrate with a gate dielectric layer thereover and a lower gate electrode structure formed over the gate dielectric layer with the lower gate electrode structure having a lower gate top. Form a planarizing layer over the gate dielectric layer leaving the gate top of the lower gate electrode structure exposed. Form an upper gate structure over the lower gate electrode structure to form a T-shaped gate electrode with an exposed lower surface of the upper gate surface and exposed vertical sidewalls of the gate electrode. Remove the planarizing layer. Form source/drain extensions in the substrate protected from the short channel effect. Form sidewall spacers adjacent to the exposed lower surface of the upper gate and the exposed vertical sidewalls of the T-shaped gate electrode. Form source/drain regions in the substrate. Form silicide layers on top of the T-shaped gate electrode and above the source/drain regions.

20 Claims, 15 Drawing Sheets

MOS TRANSISTOR

BACKGROUND OF THE INVENTION

1. Field of the Invention

This invention relates to field-effect transistor having T-shaped gate electrodes.

2. Description of Related Art

The ever smaller dimensions of FET devices have led to the employment of T-shaped gate electrodes. State of the art MOS transistors are fabricated by depositing the gate stack material over the gate oxide and substrate. Lithography and etching processes are used to define the polysilicon gate structures. Next the gate structure and silicon substrate are thermally oxidized. After this, source/drain extensions are implanted. Sometimes the implant is performed using a spacer to create a specific distance between the gate and the as implanted junction. In some instances the S/D extensions for the NFET device will be implanted with no spacer and the PFET S/D extensions will be implanted with a spacer present. A thicker spacer is typically formed after the S/D extensions have been implanted. The deep S/D implants are then performed with the thick spacer present. High temperature anneals are done to activate the junctions after which the S/D and silicides are formed on the top surface of the gate electrode.

Generational improvements for high performance CMOS are obtained by decreasing the transistor line width (L poly), reducing the gate oxide thickness, and decreasing the S/D extension resistance. Smaller L poly results in less distance between source and drain. This results in faster switching speeds for CMOS circuits. However as the L poly gets smaller, the overall area available for silicidation is reduced. This means that as L poly shrinks, line resistance is increased. Increased line resistance causes degradation in device performance.

Drive currents for MOS devices are inversely proportional to gate oxide thicknesses. Thinner gate oxides yield higher drive currents. One problem with this is that as the gate oxide is thinned, polysilicon depletion effects become more pronounced. Polysilicon depletion is an effective thickening of the gate oxide.

One method of minimizing this problem is to employ gate predoping. In this technique the blanket polysilicon-Si is implanted prior to gate patterning. The problem with the predoping method is that etching and gate profiles are difficult to control.

S/D extension resistance is another important performance factor. Drive currents can be increased by reducing S/D extension resistance. Increasing the S/D extension dose leads to lower resistance but has the unwanted side effect of increasing the junction depth. One method for overcoming this problem is to implant the extension first with no spacer present and then form a thin spacer and perform a second implant. Alternatively, a notched gate may be used to perform this task by implanting at two or more angles. The drawback to the first method is increased process complexity, while the drawback to the second method is that notched gates typically have reduced line width control.

U.S. Pat. No. 4,679,311 of Lakhani et al. entitled "Method for Fabricating Self-Aligned Field-Effect Transistor Having T-Shaped Gate Electrode, Sub-Micron Gate Length and Variable Drain to Gate Spacing" relates to a dual gate MESFET (Metal Semiconductor Field Effect Transistor) formed on a compound semiconductor substrate composed of a material such as GaAs, InP, GaAlAs, etc. Lakhani et al. teaches a method of creating a "T" structure by using laminations of various metals to form multilayered metal stack. Subsequently, the lower lamination is etched selectively to form an undercut with respect to the upper laminations to create a "T-Shaped" structure. The preferred materials of the metallic laminations are Al, Ti, and Pt and the selective etch is performed using NaOH a chemistry. In one embodiment, the source and drain electrodes are formed by an angle deposition technique.

U.S. Pat. No. 6,284,613 of Subrahmanyam et al. entitled "Method for Forming a T-gate for Better Salicidation" describes a complex method of forming a "T" gate structure by using a damascene technique in conjunction with an additional lithographic mask step. The method does not allow for improved gate activation.

U.S. Pat. No. 6,107,667 of An et al. entitled "MOS Transistor with Low-k Spacer to Suppress Capacitive Coupling Between Gate and Source/Drain Extensions" describes a method for making a MOSFET, which includes establishing a void in a thick field oxide layer on a silicon substrate. Then sidewall spacers are formed adjacent to sidewalls of the void, exposed portions of a gate oxide layer at the bottom of the void are removed. Then a high-k gate insulator is formed at the base of the void and the remainder of the void is filled with a first portion of a gate electrode so that the high-k gate insulator is sandwiched between the gate electrode and the substrate. Next the spacers and the extension of a previously formed gate oxide layer are stripped away exposing the sidewalls of the initial gate electrode. A protective layer is formed on the sidewalls of the initial gate electrode and the now exposed walls of the void. Then the space remaining within the void is filled with, a low-k gate spacer inside the protective layer. Then a conductive cap is formed over the initial gate and the gate spacer (completing a T-shaped gate) The conductive cap extends directly above the source and drain extensions of the MOSFET. In summary, the An patent teaches a method of fabricating low-k dielectric constant spacers by using a replacement gate technique. The low-k spacers are recessed and a "T" shaped gate is formed by a deposition and etch back procedure. The invention does not teach a method of simultaneously improving gate activation, extension resistance, and decoupled source drain silicidation from gate silicidation.

U.S. Pat. No. 6,239,007 Wu entitled "Method of Forming T-Shaped Gate" describes a method of forming a T-shaped gate by sequentially forming a first conformal insulation layer over an initial gate structure and then forming a second insulation layer thereover, with the first insulation layer having a faster etching rate for a given etchant. Planarization of the second insulation layer exposes part of the first insulation layer by etching with the given etchant to remove the first insulation layer sufficiently to expose the top of the initial gate structure. A conductive layer is then formed over the exposed gate structure and planarized out so that only the portion of conductive layer above the gate structure remains. The insulation layers are removed using the conductive layer above the gate structure as an etching mask leaving spacers alongside the initial gate structure. A silicide process is carried out to form a silicide layer over the conductive layer and over the semiconductor substrate, but neither a source region nor a drain region is shown. Wu teaches a method of forming a "T" gate structure by depositing a conformal film on top of a patterned gate stack. A dielectric material is deposited and planarized to the top of the covered gate. The conformal film is removed and a conductive material is deposited and planarized to form the "T" structure. This invention does not teach a method of simultaneously improving gate activation, extension resistance, and decoupled source drain silicidation from gate silicidation as our invention does.

U.S. Pat. No. 6,159,781 of Pan et al. entitled "Way to Fabricate the Self-Aligned T-Shape Gate to Reduce Gate Resistivity" describes a method of fabricating a semiconductor field effect transistor, wherein the gate has a short foot portion in contact with the semiconductor substrate for a short gate length and consequent low capacitance, and a large amount of metal in a contact portion for low gate resistance. Salicides are formed on the T-gate source on drain contact areas resulting in large, low resistance contact areas. Trench insulation regions are formed within a semiconductor substrate. A blanket dielectric layer is deposited over the device and then a first trench is etched within the dielectric layer leaving a dielectric depth of deposition between the bottom of the trench and the substrate which equals the height of the foot of the T-gate. Sidewall spacers are formed against the walls of the first trench. A second trench is etched through the bottom of the first trench down to surface of the substrate. A second trench centered within the first trench is formed which is equal to the width of the foot of the T-gate. The sidewall spacers are removed and a conductive layer is formed over the structure formed by the dielectric layer, filling both the first trench and the second trench. Then the conductive layer is planarized by CMP down to the level of the top of the dielectric layer. Then the dielectric layer is etched down to the level of the top of the surrounding trench insulation regions along the left hand side of the left wall of the first trench and the right hand side of the right wall of the first trench further using the downward extensions of the left and right wall of the first trench as the line along which the etching process is extended in a downward direction. Source and drain regions are formed in the substrate and on the immediate inside or T-gate side of the surrounding trench insulation regions. Large angle lightly doped depositions are formed on the T-gate side of the sources and drains. Salicide is formed across the top of the T-gate structure and the top of the source/drain regions. In summary the Pan et al. patent teaches a method of forming a "T" gate structure by patterning and etching a trench in a dielectric material, sidewall spacers are next fabricated and used to etch a smaller trench in the dielectric. The method in this invention is quite different from ours and to add to this, the invention does not teach a method of simultaneously improving gate activation, extension resistance, and decoupled source drain silicidation from gate silicidation as our invention does.

U.S. Pat. No. 5,559,049 of Cho for "Method of Manufacturing a Semiconductor Device" describes forming a semiconductor by forming a gate electrode in the form of T-shape and forming auxiliary gates which are capacitively coupling with the T-shape gate electrode at undercut portions below both sides of T-shape gate. A lightly doped region is formed in the silicon substrate below the auxiliary gate by utilizing a doped oxide film, and forming a heavily doped region connected to a lightly doped region. A short channel length is provided. Auxiliary gates float electrically against the lightly doped extension to reduce the extension resistance. The "T" shape is created by using a multiple layer gate material with the lower layer etched selectively to the upper layer. The structure and method of Cho are very different from the present invention which utilizes a self aligned method to form the "T" gate structure. Cho does not teach a method to simultaneously improve gate activation by decoupling source drain and gate implantation steps, reduce extension resistance by angled and normal incidence extension implants, and decoupled source drain silicidation from gate silicidation steps.

U.S. Pat. No. 6,270,929 of Lyons, et al. entitled "Damascene T-Gate Using a Relacs Flow" describes a method for fabricating a T-gate structure is provided. A structure is provided that has a silicon layer covered with a gate oxide layer below a polysilicon layer covered in turn by an insulating layer. A photoresist layer is formed over the insulating layer with an opening therethrough extending partially into the insulating layer from a top surface thereof to a first depth. The photoresist layer is swelled to reduce the size of the opening in the photoresist layer. The opening is then extended in the insulating layer from the first depth to a second depth. The opening is wider from the top surface of the insulating layer to the first depth than the opening is from the first depth to the second depth. The opening is then filled with a conductive material to form a T-gate structure. Lyons et al uses a resist reflow technique to create the "T" structure. First, a resist pattern is used to etch a trench in a dielectric material. Next, the resist is swelled so that the resist pattern becomes narrow compared to the original pattern. Then, a second trench with smaller dimensions is etched into the dielectric. The structure is then filled to form the "T". The method of Lyons et al is very different from the present invention in that it does not teach a method to simultaneously improve gate activation by decoupling source/drain and gate implantation steps, reduce extension resistance by angled and normal incidence extension implants, and decoupled source drain silicidation from gate silicidation steps as our invention does. No description of how to form extensions or source or drain regions is included in Lyons et al.

U.S. Pat. No. 6,309,933 Li, et al. entitled "Method of Fabricating T-Shaped Recessed Polysilicon Gate Transistors" describes a method of fabricating a semiconductor transistor device. A pad layer is formed over an upper silicon layer, and a well is implanted within the upper silicon layer. A lower SiN layer is deposited and patterned over the pad dielectric layer to define a lower gate area. The pad dielectric layer and the upper silicon layer within the lower gate area are etched to form a lower gate trench. A sacrificial liner oxide layer is formed in the trench followed by a threshold implant followed by a punchthrough implant into the upper silicon layer through the liner oxide layer. A lower gate portion is formed within the lower gate trench. An upper oxide layer is formed over the lower SiN layer. An upper SiN layer is formed over the upper oxide layer. The upper SiN layer is etched to define an upper gate trench having a predetermined width greater than the lower gate trench predetermined width. An upper gate portion is formed within the upper gate trench, wherein the lower and upper gate portions form a T-shaped gate. The etched upper SiN, upper oxide, and lower SiN layers are removed to expose the T-shaped gate extending above the pad dielectric layer. An uppermost oxide layer is formed over the exposed T-shaped gate. LDD regions are formed adjacent to the gate with an angled ion implantation. SiN sidewall spacers are formed adjacent the exposed vertical side walls of the lower polysilicon gate portion. S/D ion implantation is made forming S/D regions 800Å to 1000Å below the surface of the substrate. Silicide regions are formed over the T-shaped gate and source/drain regions.

U.S. Pat. No. 6,326,290 Chiu entitled "Low Resistance Self Aligned Extended Gate Structure Utilizing a T or Y Shaped Gate Structure for High Performance Deep Submicron FET" describes forming a low resistance self aligned salicided T-shaped FET gate structure. A gate oxide layer formed on a substrate active area is covered with a first poly gate electrode layer. Those layers are patterned into a gate electrode stack followed by implanting S/D lightly doped extensions. Oxide sidewall spacers are formed, Deep region dopant is implanted to form S/D regions. Then a very thick layer of a conformal covering oxide is formed over the device covering the gate electrode stack and the active device surface, planarized to a level above the stack and selectively etched to expose the top of the first poly gate electrode. The first poly electrode is selectively etched to recess it within the covering oxide layer. Then isotropic etching of the covering oxide opens a depression therein around the top of the first poly electrode. A second layer of poly is deposited and planarized over the active device area leaving the second poly remaining only in the depression on top of the first poly electrode and within the oxide covering layer forming a T shaped top of the gate electrode. Selective dry etching follows removing the covering oxide layer except for oxide sidewalls spacers remaining on the vertical sides of the first poly electrode between the active device surface and the second poly T shaped top thereby forming gate spacer oxide isolation. Then salicide is formed over the top surfaces of the second poly T shaped element and the device active area.

SUMMARY OF THE INVENTION

An object of this invention is a method providing an FET device that has improved gate activation, line resistance, and S/D extension resistance.

Another object of this invention is to provide a method of decoupling the gate from source drain ion implantation, thereby, achieving a highly activated gate with no degradation to short channel behavior. Improved gate activation is a very attractive feature of this device since polysilicon depletion is a major concern of advanced high performance CMOS.

Still another object of this invention is to provide a method for providing enhanced line resistance without compromising minimum polysilicon line width or Across Chip Linewidth Variation (ACLV).

In accordance with this invention, a method is provided for fabricating a semiconductor transistor device comprises the steps as follows. Provide a semiconductor substrate with a gate dielectric layer thereover and a lower gate electrode structure formed, over the gate dielectric layer with the lower gate electrode structure having a lower gate top. Form a planarizing layer over the gate dielectric layer leaving the gate top of the lower gate electrode structure exposed. Form an upper gate structure over the lower gate electrode structure to form a T-shaped gate electrode with an exposed lower surface of the upper gate surface and exposed vertical sidewalls of the gate electrode. Optionally, form a silicide on the exposed portion of the gate electrode. Remove the planarizing layer. Form source/drain extensions in the substrate. Form sidewall spacers adjacent to the exposed lower surface of the upper gate and the exposed vertical sidewalls of the T-shaped gate electrode. Form source/drain regions in the substrate. Form silicide layers on the source/drain regions.

In accordance with the method of this invention a self-aligned widening technique forms a "T" structure which allows for increased area to form silicide. Current data shows that it is difficult to form $CoSi_2$ on lines that are 60 nm and below in width. Thus, the feature of increasing the top portion is critical to high performance logic applications.

In accordance with this invention source/drain extension characteristics are improved by utilizing the T structure to perform multiple angle ion implants without additional lithography steps. This allows the NFET extension to have an angled as well as a normal incidence ion implant to reduce extension resistance. The method also allows for the PFET to be implanted at a normal incidence so that the "T" structure blocks the ion implant to create an offset for the as implanted PFET extension. The advantage here is that no PFET spacer is required. Specifically, the fact that there is no need for a PFET spacer overcomes problems associated with arsenic (As) dose loss, since it has been found that the PFET spacer processing causes a severe dose loss for the NFET extension.

Still further in accordance with this invention, a self-aligned method is provide for independently forming silicide on the gate electrode compared to the source drain. This is a highly desirable feature for thin silicon SOI applications, since it allows a thicker silicide to be formed on the gate and a thinner silicide to be formed on the source drain region. This is critical because the external resistance of the device increases if the source drain Si becomes completely silicided while the gate resistance is reduced and overall silicide yield improves with increased silicide thickness.

Preferably recess the lower gate structure to form a recessed lower gate within the planarizing layer before forming the upper gate; etch the planarizing layer to define a wide recess therein having a width greater than the width of the lower gate electrode structure; and then form the upper gate within the wide recess on the recessed lower gate whereby the lower gate electrode structure and upper gate structure form the T-shaped gate electrode.

Alternatively, it is preferred to partially recess the planarizing layer below the level of the lower gate top before forming the upper gate; then selectively grow the upper gate on exposed surfaces of the lower gate top to form the T-shaped gate electrode.

Another alternative is to recess the lower gate structure to form a recessed lower gate within the planarizing layer before forming the upper gate; then grow the upper gate on the surface of the lower gate within the recess and overgrow the upper gate above the planarizing layer whereby the lower gate electrode structure and upper gate structure form the T-shaped gate electrode.

Another alternative is to perform a silicidation to the exposed portion of the gate stack.

Preferably form the sidewall spacers of silicon nitride on the exposed lower surface of the upper gate and on the vertical sidewalls of the T-shaped gate electrode; form the NFET extensions by a combination of a vertical angle ion implant of arsenic ions and a tilted angle ion implant of arsenic ions, and form the PFET extensions by only a vertical angle ion implant of boron ions.

It is further preferred to form the sidewall spacers of silicon nitride on the exposed lower surface of the upper gate and on the vertical sidewalls of the T-shaped gate electrode, form the NFET extensions by a combination of a vertical angle ion implant of dopant ions and a tilted angle ion implant of dopant ions, and form the PFET extensions by a vertical angle ion implant of dopant ions.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENTS

First Embodiment

Figure 13:
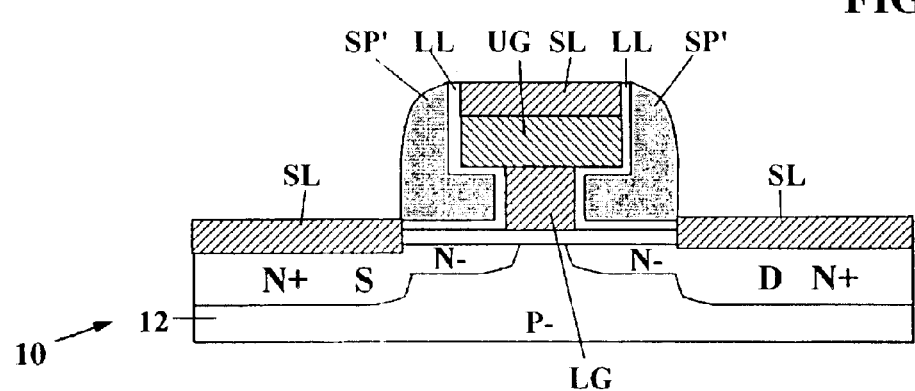
Figure 14A:
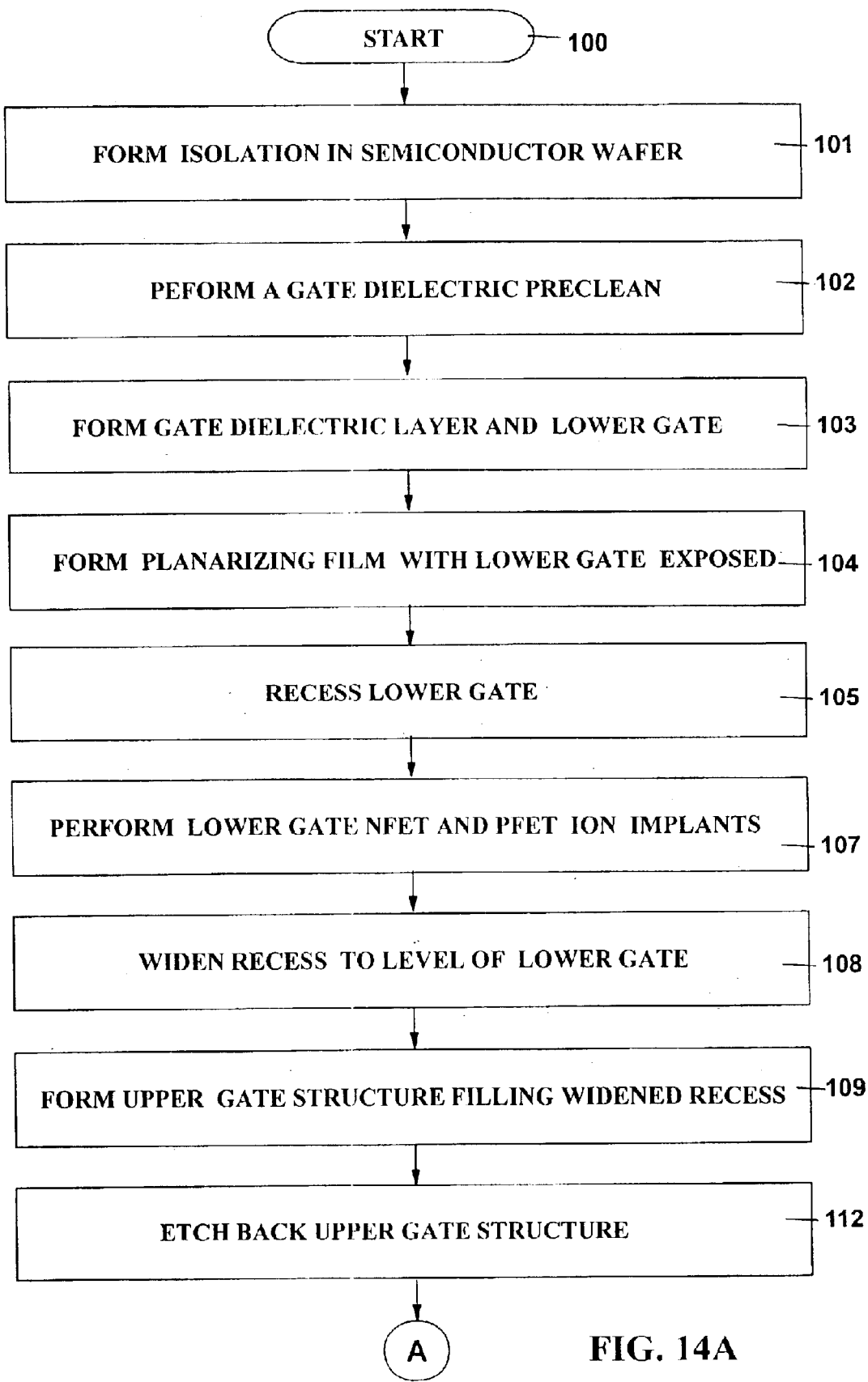
Figure 14B:
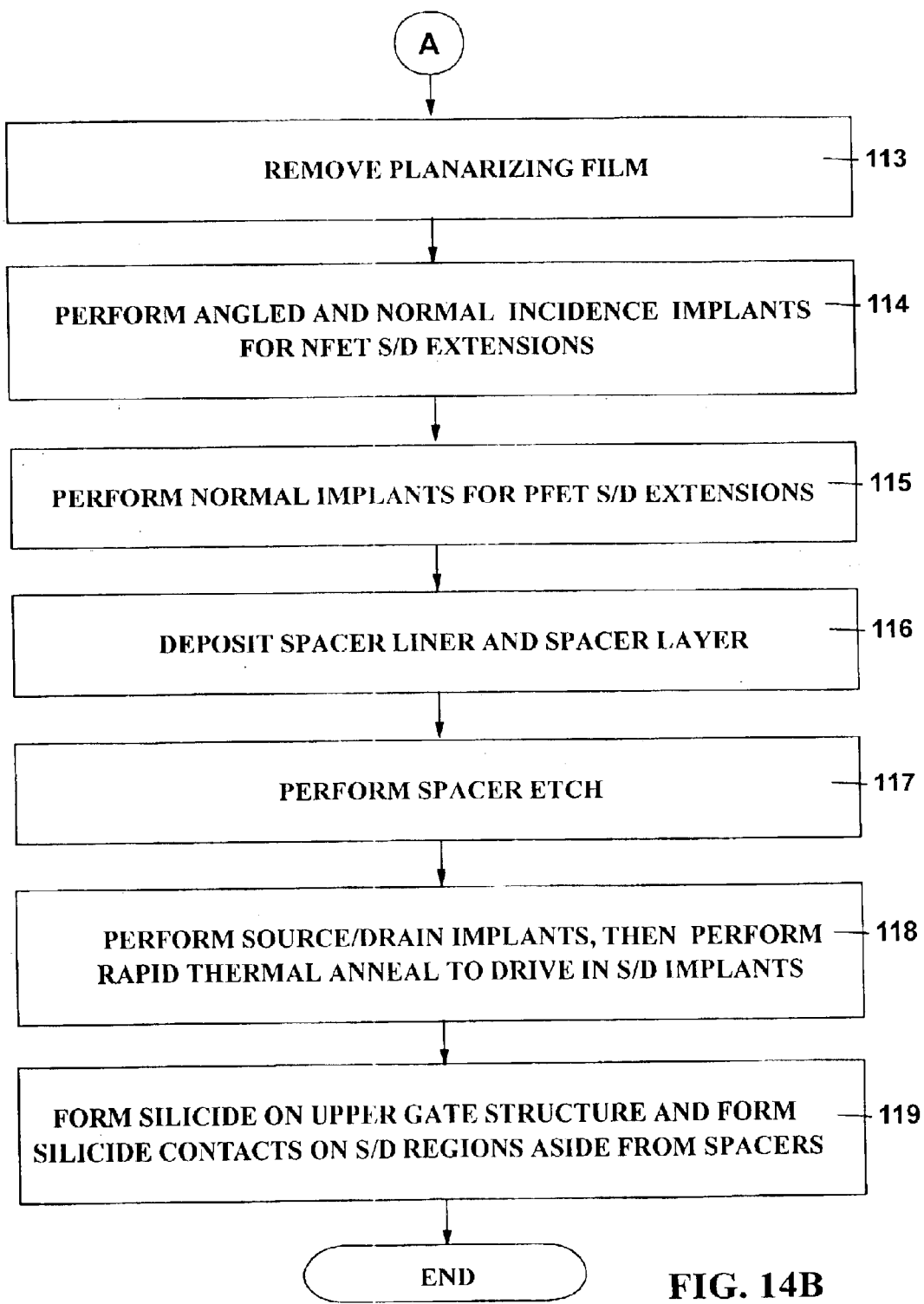
Figure 15:
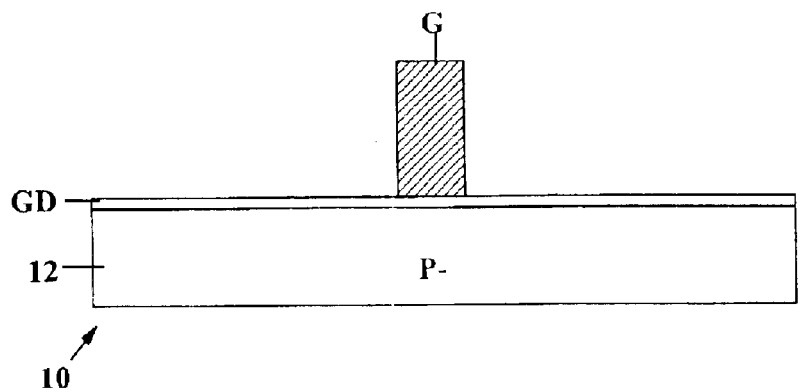
FIGS. 15–27 show a device being manufactured by a second sequence of process steps in accordance with this invention for forming a device with the process flow being shown in FIGS. 27A–27B.
Figure 16:
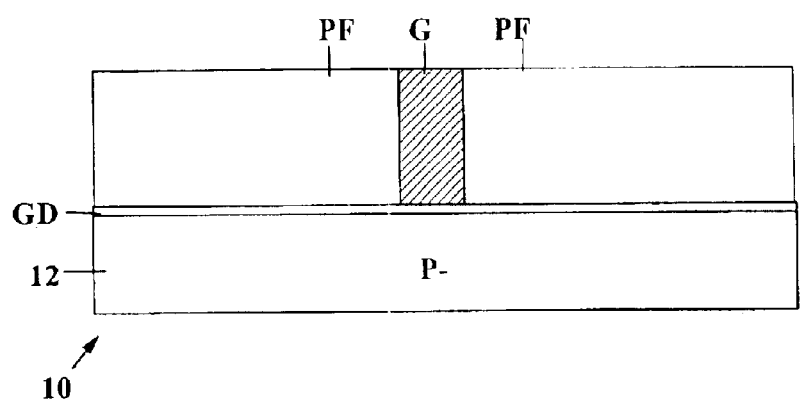
Figure 17:
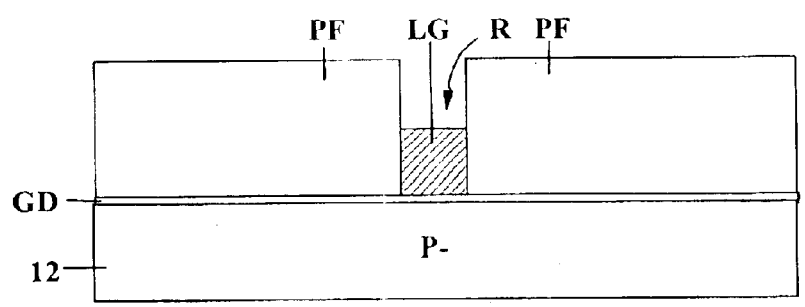
Figure 18:
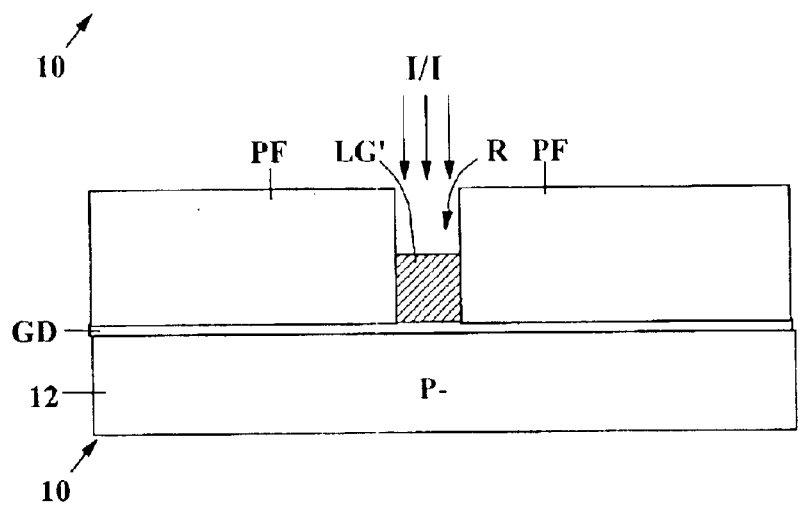

FIGS. 1–13 show a device being manufactured by a first sequence of process steps in accordance with this invention for forming a device with the process flow being shown in FIGS. 14A–14B.

Deposition of Gate Dielectric and Initial Gate Layers and Gate Stack Patterning.

Figure 1:
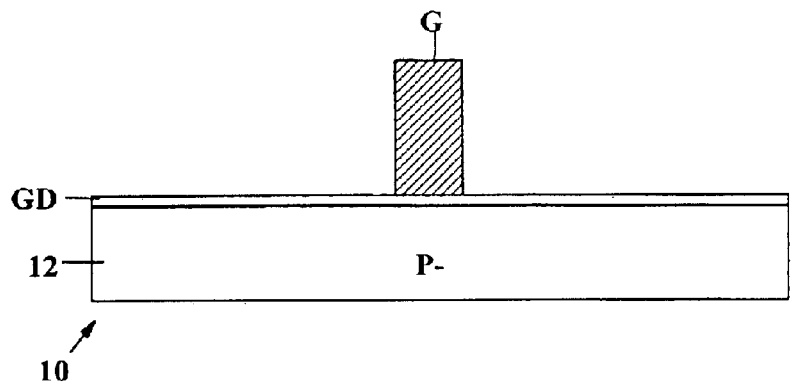
FIGS. 1–13 show a device being manufactured by a first sequence of process steps in accordance with this invention for forming a device with the process flow being shown in FIGS. 14A–14B.

FIG. 1 shows a device 10 at the beginning of manufacture thereof. The process of this embodiment of the invention is illustrated in FIGS. 14A and 14B starting with step 100 which leads to step 101. The device 10 is being formed on a silicon containing wafer 12. Wafer 12 may be a bulk wafer or a Silicon-On-Insulator (SOI) wafer. Alternatively, wafer 12 may comprise Silicon-Germanium (SiGe) layers or may be composed of pure silicon (Si), or any other semiconductor material.

In step 101 in FIG. 14A, isolation regions (not shown) are formed in the wafer 12. Suitable isolation regions may comprise shallow trench isolation (STI) regions, LOCOS (FOX) isolation regions, or a modified version of either isolation scheme, as will be well understood by those skilled in the art.

Thereafter, in step 102 in FIG. 14A, a gate dielectric pre-clean is performed to prepare the surface of the wafer 12 for deposition of the gate dielectric layer GD.

In step 103 in FIG. 14A, the gate dielectric layer GD shown in FIG. 1 is formed on the newly cleaned surface of the wafer 12. The gate dielectric GD may comprise a gate oxide such as pure Silicon DiOxide ($SiO_2$), nitrided $SiO_2$ and or any combination of $SiO_2$ and Nitrided $SiO_2$, or another high dielectric constant layer (high K layer).

Next, material to be patterned into the lower portion of a T-shaped gate electrode is deposited and patterned to form an initial gate G seen in FIG. 1. The initial gate G will be patterned into the lower portion of the T-shaped gate. The initial gate G may be composed of a material such as polysilicon, amorphous Silicon (a-Si), or a suitable metal. In a preferred embodiment, the gate material is polysilicon and the initial gate G is patterned using a conventional lithography and etch methodology to produce the initial gate shown in FIG. 1. Alternatively, the initial gate G may also be patterned by the well known damascene method or by a sidewall image transfer technique.

Application of Thermally Stable Planarizing Film

Figure 2:
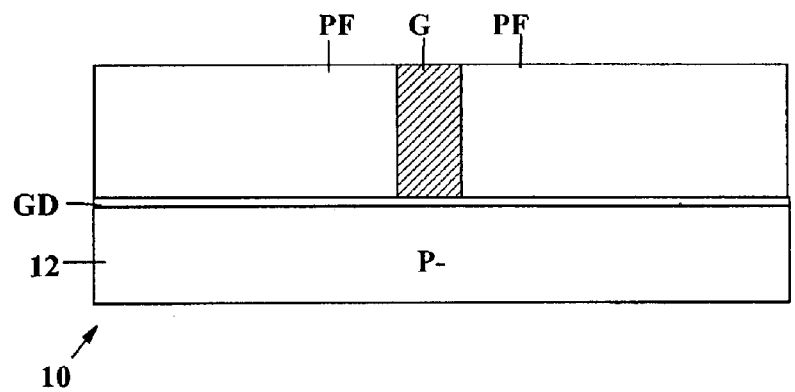

Next, in step 104 in FIG. 14A and as shown in FIG. 2 the device 10 of FIG. 1 is shown after a thermally stable, planarizing film PF has been applied to the top surface of the initial gate G and gate dielectric GD on wafer 12. The planarizing film PF has been planarized by a Chemical Mechanical Polishing (CMP) technique until the top of initial gate G is exposed. At this point, the top of gate G is coplanar with the planarizing film PF. The planarizing film PF may be self-planarizing, e g. the film PF may be formed by use of a HDP (High Density Plasma) process or by application of spin-on glasses. Alternatively the planarizing film PF may be planarized by Chemical Mechanical Polishing (CMP).

In one embodiment the thermally stable, planarizing film PF is $SiO_2$ which my be deposited by a variety of different techniques including High Density Plasma (HDP), Chemical Vapor Deposition (CVD), Rapid Thermal Chemical Vapor Deposition (RTCVD) or Plasma Enhanced Chemical Vapor Deposition (PECVD)

Polysilicon Gate Stack Recessed Selective to Planarizing Film

Figure 3:
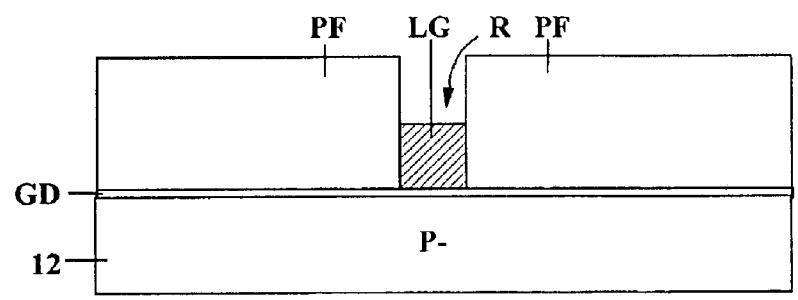

Next, in step 105 in FIG. 14A and as shown in FIG. 3 the device 10 of FIG. 1 is shown after the initial gate G, which was coplanar with the thermally stable planarizing film PF has been etched away at its top surface so that the initial gate G has been lowered to form a recessed lower gate LG at the bottom of a recess R below the surface of the planarizing film PF. The recess R may be formed using any etching method which is capable of etching the material of the initial gate G at a significantly faster rate than the rate of etching of the planarizing film PF. Etchants such as a conventional Hydrogen Bromide (HBr) type dry polysilicon gate stack etch is sufficient for this purpose. Additionally, a wet etch may be used to recess the initial gate G selectively with respect to the planar film. For example, a Nitric Acid:Hydrofluoric Acid ($HNO_3$:HF) etchant in the proper ratio is known to etch polysilicon faster than it etches $SiO_2$. Potassium Hydroxide (KOH) is another solution that is capable of etching polysilicon faster than $SiO_2$ in a controlled manner.

Gate Doping by Ion Implantation or other Dopant Technique

Figure 4:
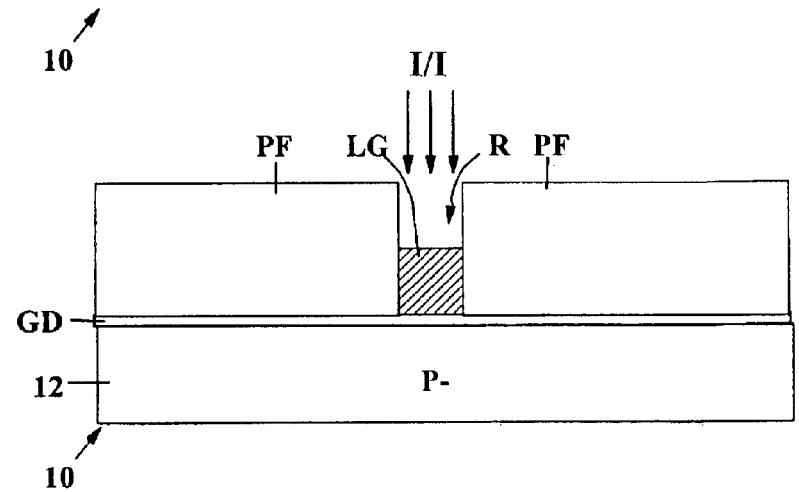

Next, in step 107 in FIG. 14A and as shown in FIG. 4, at this point in the process, gate electrode implants are performed into the NFET and PFET lower gates LG through the top surface thereof at the bottom of the recess R. The ability to perform the gate implants at this point is advantageous since the reduced height of the lower gates LG means that lower energy implants may be employed to place a high dose of dopant in the lower gates LG at a depth very close to the gate dielectric GD buried therebelow without causing damage thereto. Another advantage of performing the gate implant at this point in the process is that the lower gates LG may be implanted independently from the source/drain regions which are formed subsequently. In a conventional sequence of process steps, the PFET is blocked by photoresist while the NFET gate is implanted. Thereafter the NFET may be blocked while the PFET gate is implanted.

Widening of Top Portion of Planarizing Film over the Recessed Lower Gate

Figure 5:
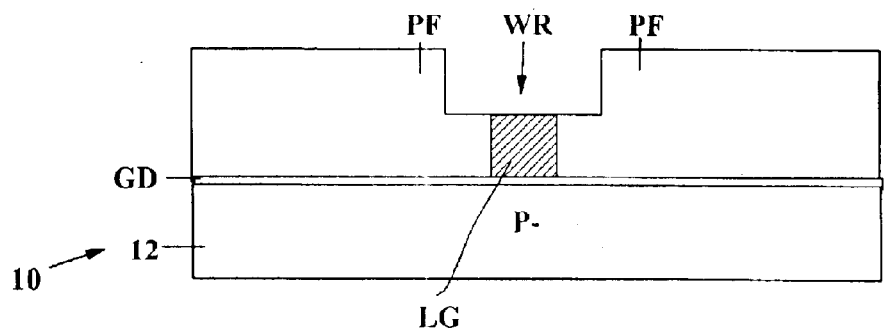

Next, in step 108 in FIG. 14A and as shown in FIG. 5 the recess R in the planarized film PF is widened by means of a wet or dry etching method to form a wide recess WR in the top portion of the planarized film PF centered over the recessed lower gate LG using an isotropic dry etch process that is selective to the material of the lower gate LG, e.g. doped polysilicon. For example, a dry etch chemistry that is capable of etching a planarized film composed of $SiO_2$ selective to the polysilicon gate is the combination of Methyl Trifluoride ($CHF_3$) and CarbonTetrafluoride ($CF_4$). Alternatively, a planarized film PF formed of an $SiO_2$ layer may be widened using a dilute hydrofluoric acid (HF) solution to form the wide recess WR.

Polysilicon Deposition

Next, in step 109 in FIG. 14A an upper gate layer composed of polysilicon, amorphous silicon (a-Si), or metal is then deposited overfilling the wide recess WR and covering the top surface of the planarized film PF.

Polysilicon Etchback or CMP

Figure 6:
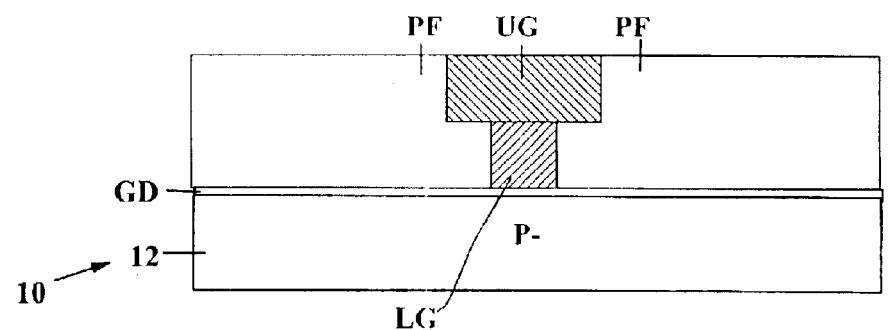

Next, in step 112 in FIG. 14B and as shown in FIG. 6, the layer used to form the upper gate UG is etched back (planarized) using a conventional CMP technique, as indicated schematically in FIG. 6.

At this point in the process an optional step to independently silicide the gate may be performed if desired.

Figure 7:
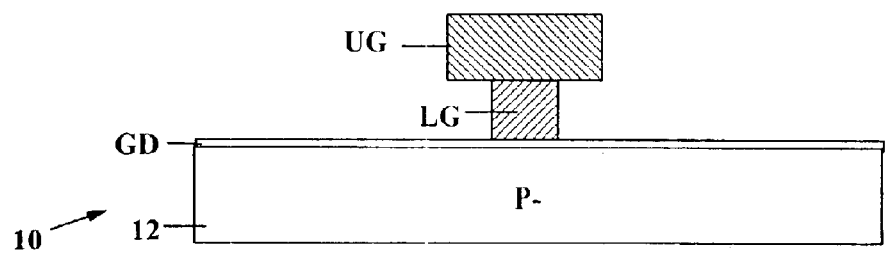

Planarizing Film Removal of Planar Film Selective to the Gate Stack by Wet or Dry Etching Technique In step 113 in FIG. 14A and as shown in FIG. 7, the planarized film PF is now removed, using a dry etch chemistry like $CHF_3$ and $CF_4$ that is capable of etching the planarized film PF of $SiO_2$ while not etching the gate materials of upper gate UG and lower gate LG. Alternatively, The planarized film PF of $SiO_2$ may be remove by a dilute hydrofluoric acid (HF) chemistry.

Normal and Angled S/D Extension Implants for NFET Normal and Angled Ion Implant for NFET Extensions, Normal Incidence Ion Implant for PFET Extensions.

Figure 8:
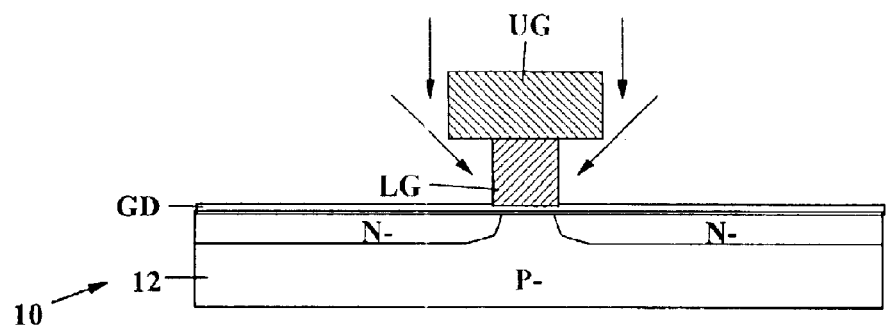

Next, in step 114 in FIG. 14B and as shown in FIG. 8, in a conventional CMOS process flow, the PFET regions of the device 10 are now blocked using photoresist and the NFET extensions are implanted with arsenic ions at a normal incidence angle as shown in FIG. 8. Additional NFET extension implants of arsenic ions are performed at an angle to reduce extension resistance.

Halo implants may also be done at an angle.

Next, the photoresist for the NFET extension implant process is removed using a standard photoresist stripping method.

S/D Extension Implants for PFET

Figure 9:
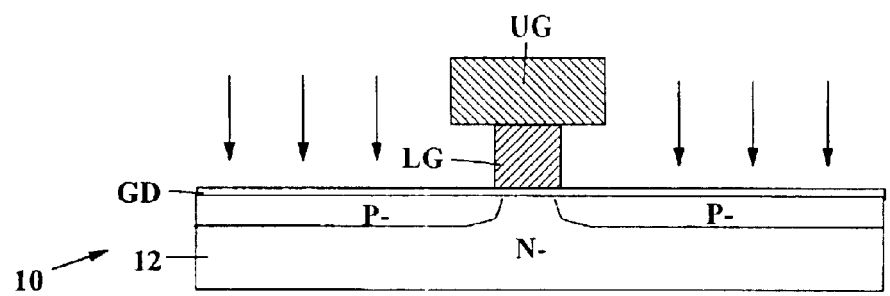

Next, in step 115 in FIG. 14B and as shown in FIG. 9, the NFET is now blocked using photoresist to allow the PFET extension to be implanted with boron ions at a normal incidence angle as shown in FIG. 9.

Spacer Deposition and Etch

Figure 10:
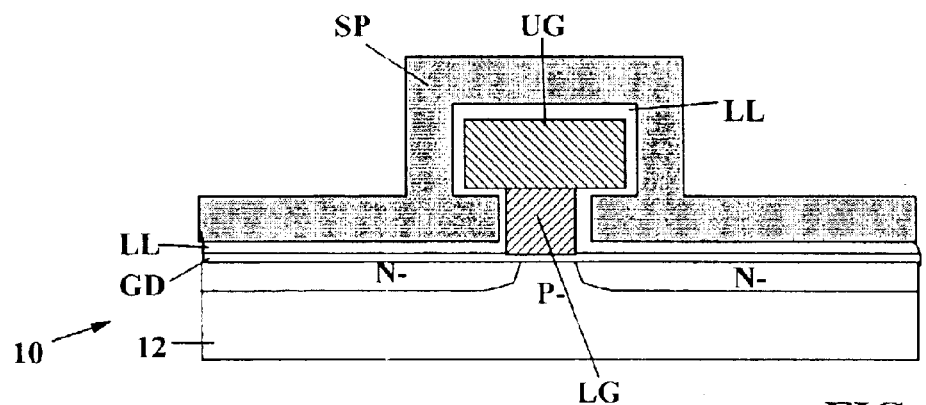

Next, in step 116 in FIG. 14B and as shown in FIG. 10 a conformal blanket spacer material SP is deposited by any one of a variety of techniques including but not limited to CVD, RTCVD or PECVD. The spacer material SP may be composed of a material selected from the group consisting of $SiO_2$, SiN or SiON.

In a preferred embodiment an $SiO_2$ liner layer LL shown on the exterior of the upper gate UG, lower gate UG and the surface of the gate dielectric GD is deposited initially below the spacer material SP. The purpose of the liner layer LL of $SiO_2$ is to act as a spacer SiN etch stop. In the case of employment of the liner layer, the spacer material SP comprises SiN which is deposited by CVD. The film deposition technique is such that the film is conformal.

Alternatively, the liner layer LL can be formed by a conventional gate reoxidation carried out prior to or instead of deposition of $SiO_2$ to form the liner layer LL.

Spacer Etch

Figure 11:
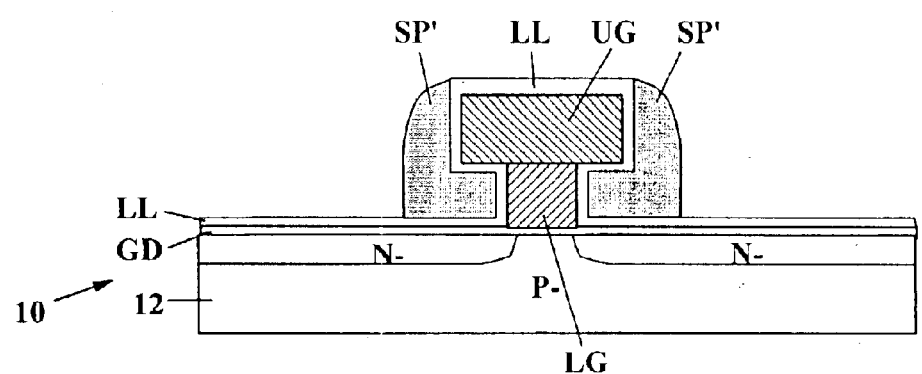

Next, in step 117 in FIG. 14B and as shown in FIG. 11, the spacer layer SP is etched using a standard spacer etch chemistry that is capable of etching the spacer material away from the exposed horizontal surfaces but leaves the spacer material present on the vertical surfaces thereby forming sidewall spacers SP' adjacent to the T-shaped gate structure formed by the upper gate UG and the lower gate LG.

Source Drain (S/D) Implants for NFET and PFET

Figure 12:
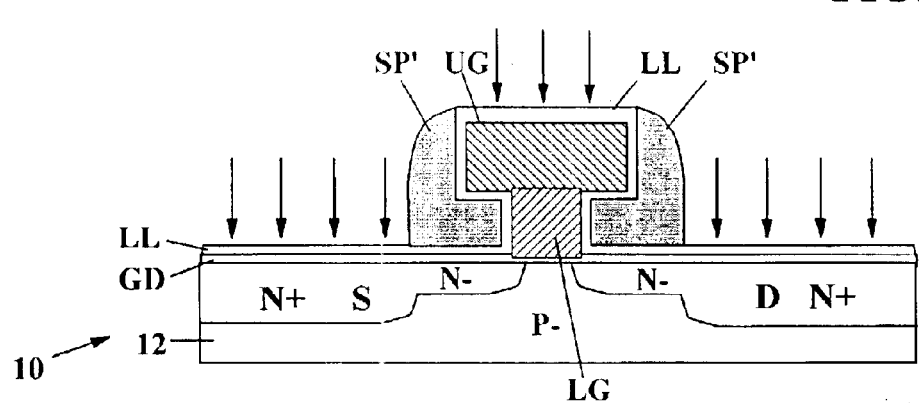

Next, in step 118 in FIG. 14B and as shown in FIG. 12, the sidewall spacers SP' are used to define the region for deep source/drain (S/D) implantation as will be well understood by those skilled in the art.

Perform Rapid Anneal

After the source/drain implants shown by FIG. 12 and indicated by step 118 in FIG. 14B, a rapid thermal anneal is performed to drive in the source/drain (S/D) dopant as will be well understood by those skilled in the art.

Silicide Formation

Next, in step 119 in FIG. 14B and as shown in FIG. 13, a standard preclean is performed. The preclean process is a wet etch using an etchant such as an aqueous solution of hydrofluoric acid (HF) to remove the exposed liner layer LL and the gate dielectric GD therebelow aside from T-shaped gate structure UG/LG.

Then contacts are formed in a silicidation process in which a silicide selected from cobalt silicide ($CoSi_2$), nickel silicide (NiSi), or any other silicide process is used to create a low resistance contact as shown in FIG. 13.

Second Embodiment

Figure 27A:
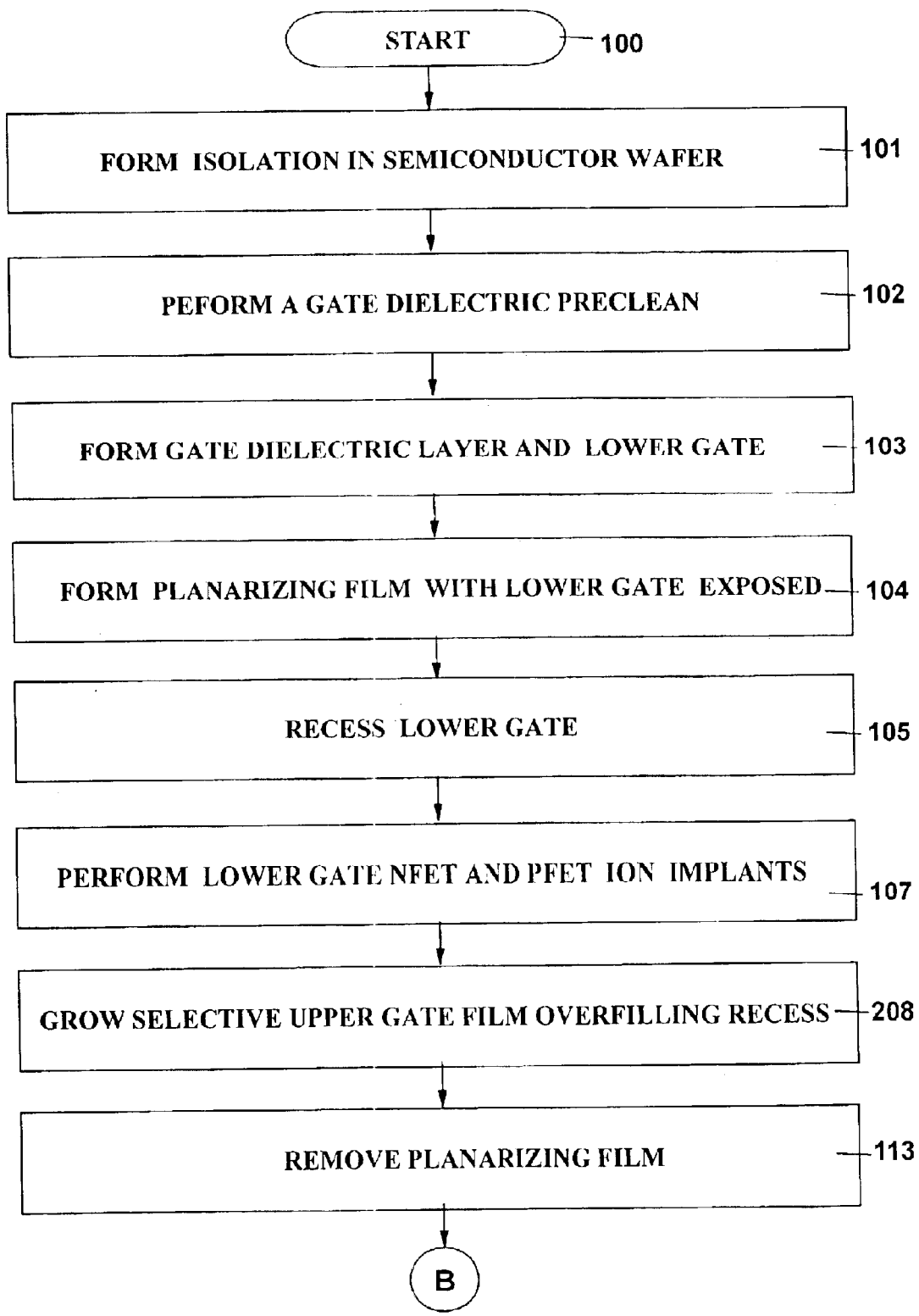
Figure 27B:
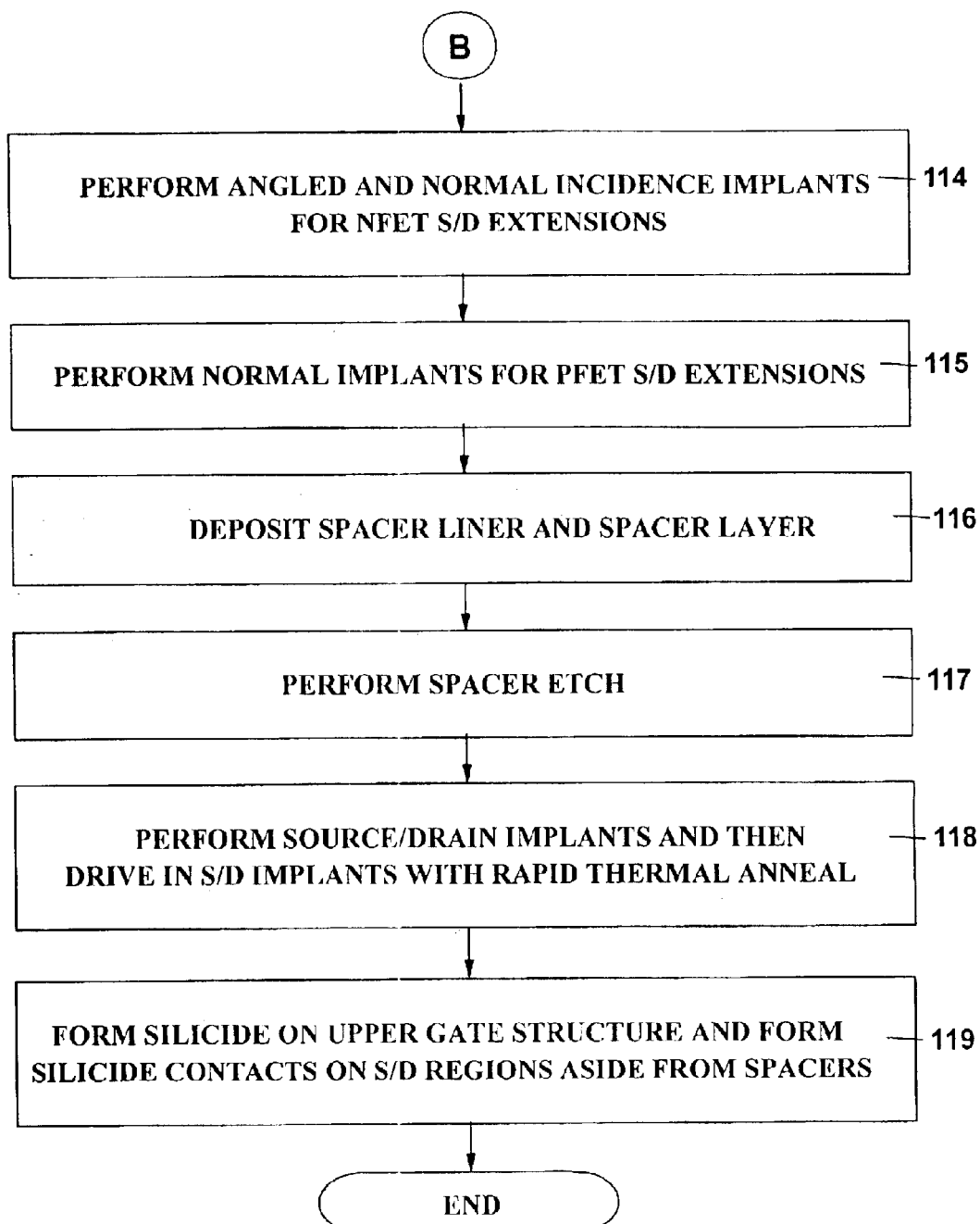

FIGS. 15–27 show a device being manufactured by a second sequence of process steps in accordance with this invention for forming a device with the process flow being shown in FIGS. 27A–27B.

The process is modified from the First Embodiment but the first four steps shown in FIGS. 15–18 are identical to the process steps in FIGS. 1–4 as shown by the process steps 101, 102, 103 104, 105, 106 and 107 described above, in FIG. 27A However, steps 108 and 109 in FIG. 14A and step 112 are omitted from the second embodiment and step 208 is substituted therefor.

Grow Upper Gate by Selective Deposition

Figure 19:
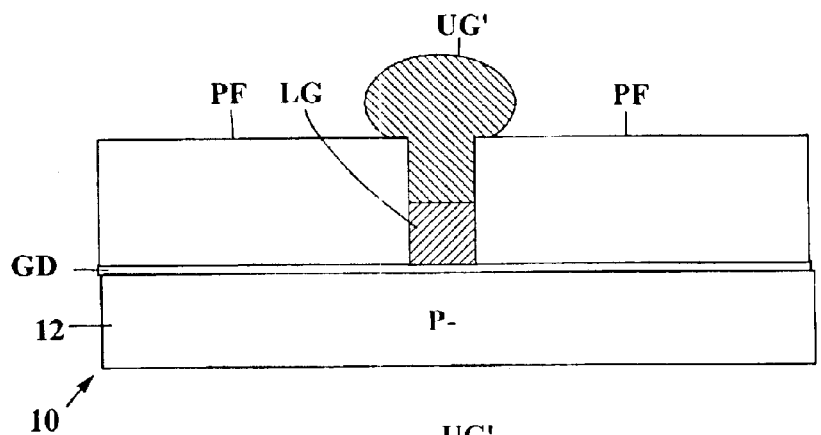
Figure 20:
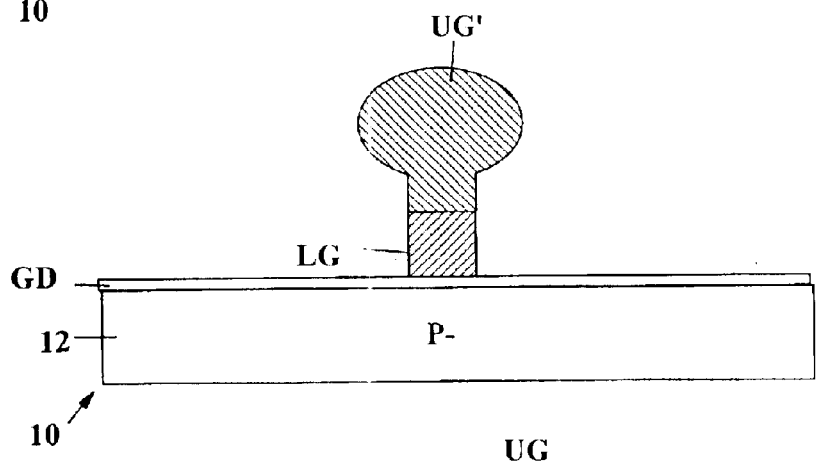
Figure 21:
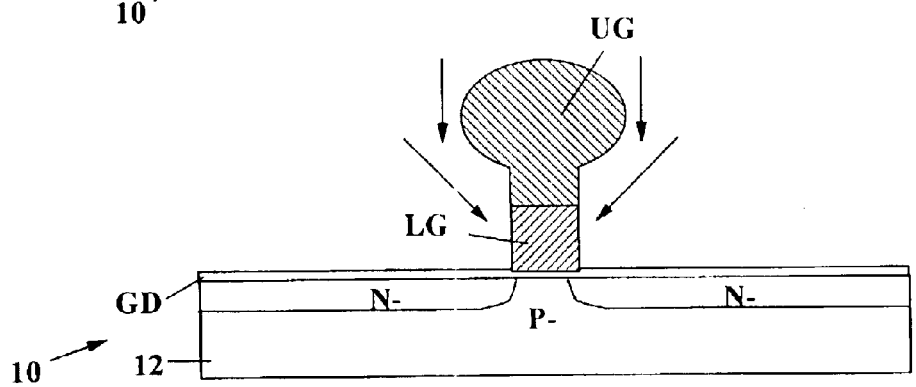
Figure 22:
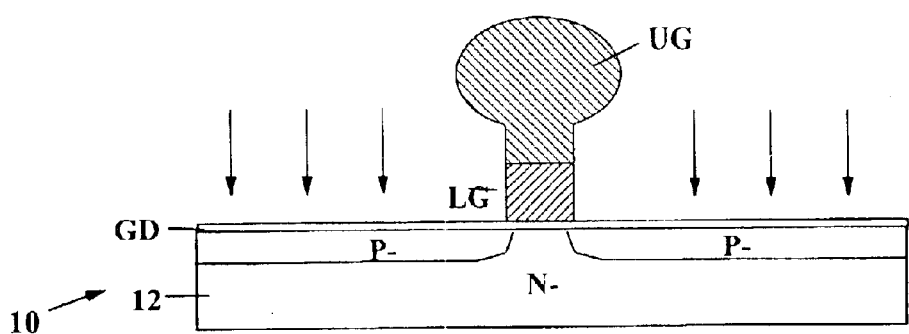

Referring to FIG. 19 and to step 208 in FIG. 27A, after step 107, the upper gate UG'is formed in the recess R by selectively overgrowing a film of silicon or tungsten upon the top surface of the lower gate LG in the recess R which grows above the top surface of the planarized film PF.

The growing process employed in step 208 is selective growth of silicon or tungsten. In the case of silicon a CVD process is performed using silane or dichlorosilane with HCl as the source of silicon. This can be accomplished by selective growth of Si on precleaned Si surfaces which may be performed in a LPCVD reactor at high temperatures around 900° C. using dichlorosilane ($SiCl_2/H_2$), or other chlorosilane gasses and HCl gasses.

The silicon layer of step 208 can be deposited by Rapid Thermal Chemical Vapor Deposition (RTCVD). Other chemical vapor deposition techniques are also useful for depositing a selective silicon layer. Various silicon sources or precursors, such as silicon tetrachloride (SiCl4), dichlorosilane ($SiH_2 Cl_2$), trichlorosilane ($SiHCl_3$), and silane ($SiH_4$), are useful for growing selective silicon. Hydrogen ($H_2$) serves as a dilutant; and hydrogen chloride (HCl) gas is used to enhance the selectivity of the growth.

In the case of the tungsten of step 208 a process of chemical vapor deposition of tungsten from tungsten hexafluoride can be employed. To form a selective coating of tungsten CVD techniques are preferred. In CVD of tungsten, tungsten reduction is induced from a tungsten hexafluoride ($WF_6$) source gas.

The deposition of selective W in step 208 can be by CVD of silane and hydrogen reduction of $WF_6$ at a temperature of around 400° C.

Figure 23:
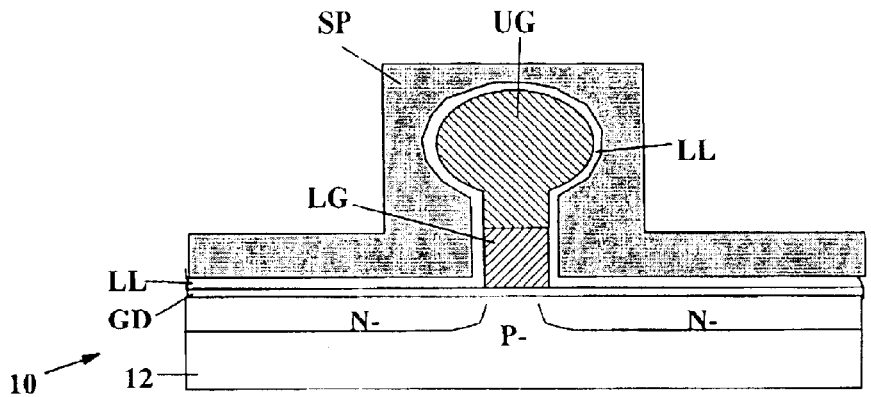
Figure 24:
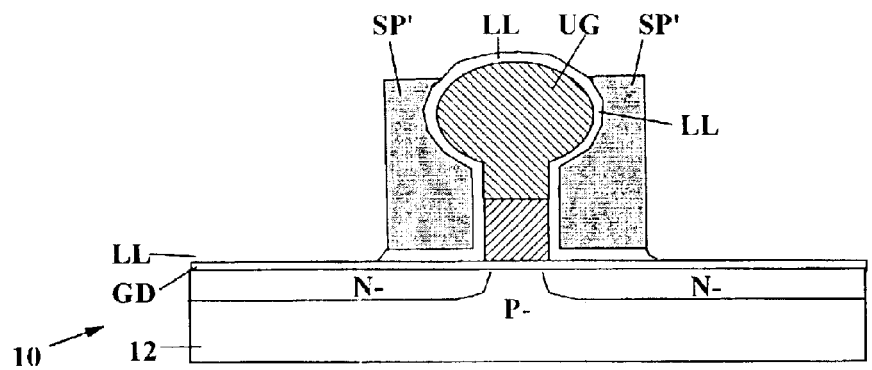
Figure 28:
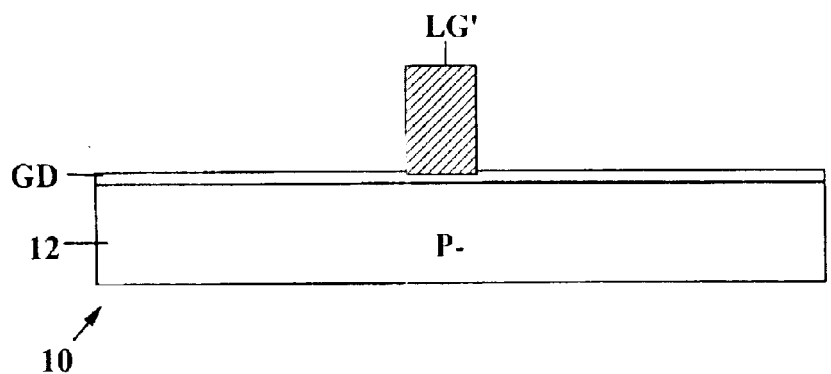
FIGS. 28–39 show a device being manufactured by a third sequence of process steps in accordance with this invention for forming a device with the process flow being shown in FIGS. 40A–40B.
Figure 29:
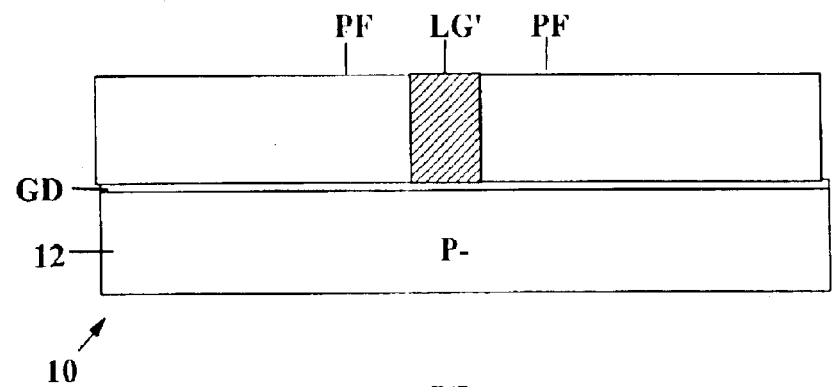
Figure 30:
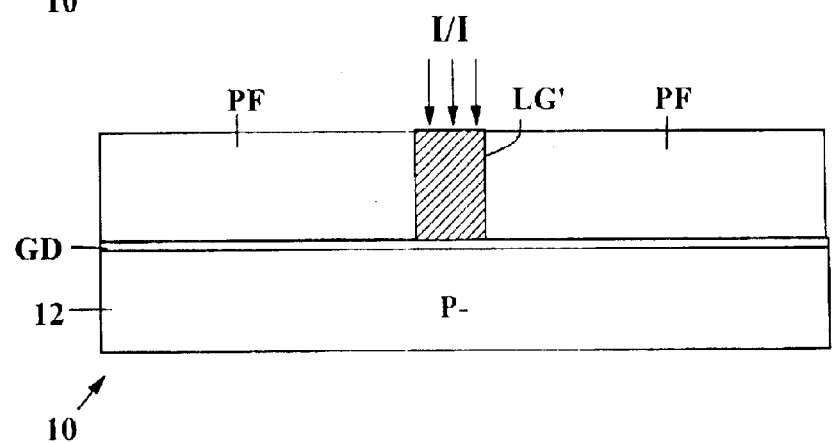
Figure 31:
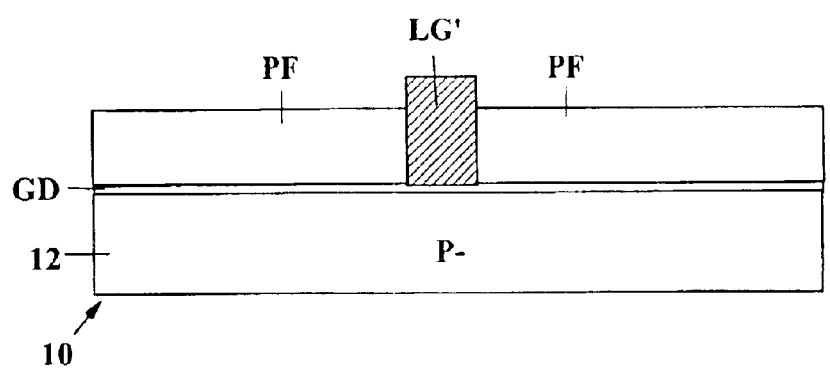

The remaining process steps 113, 114, 115, 116 and 117 in FIG. 28B are similar to those in the first embodiment except that between steps 117 and 118, a rapid anneal is performed. The modifications of the geometry of the spacer SP' and the like are shown in FIGS. 23–25

Perform Rapid Anneal

Figure 25:
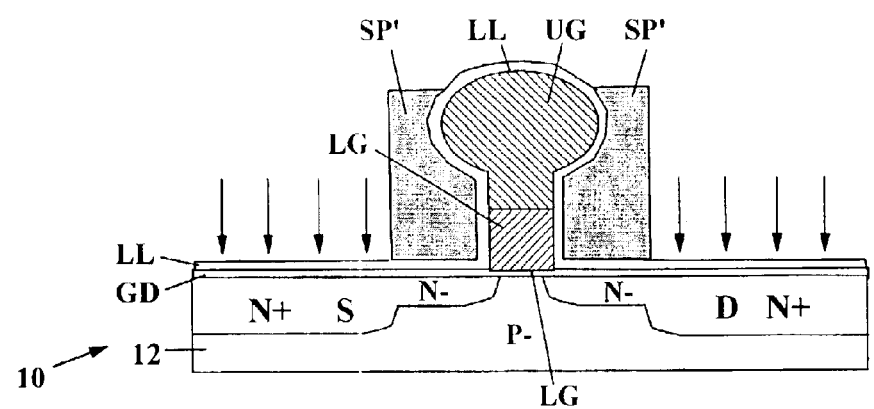
Figure 26:
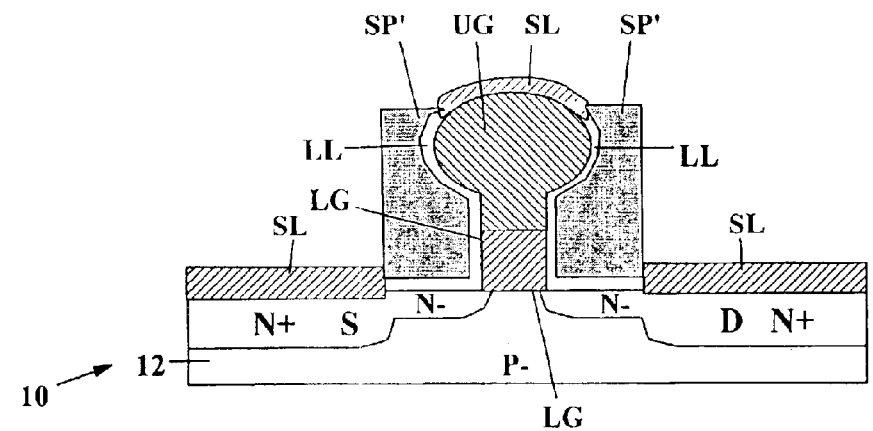

After the source/drain implants shown by FIG. 25 and indicated by step 118 in FIG. 27B, a rapid thermal anneal is performed to activate the dopant.

Then the process returns to the step of performing the preclean and formation of the silicide layer SL in step 118 in FIG. 13 and FIG. 28B (as in step 118 in FIG. 14B).

Third Embodiment

Figure 40A:
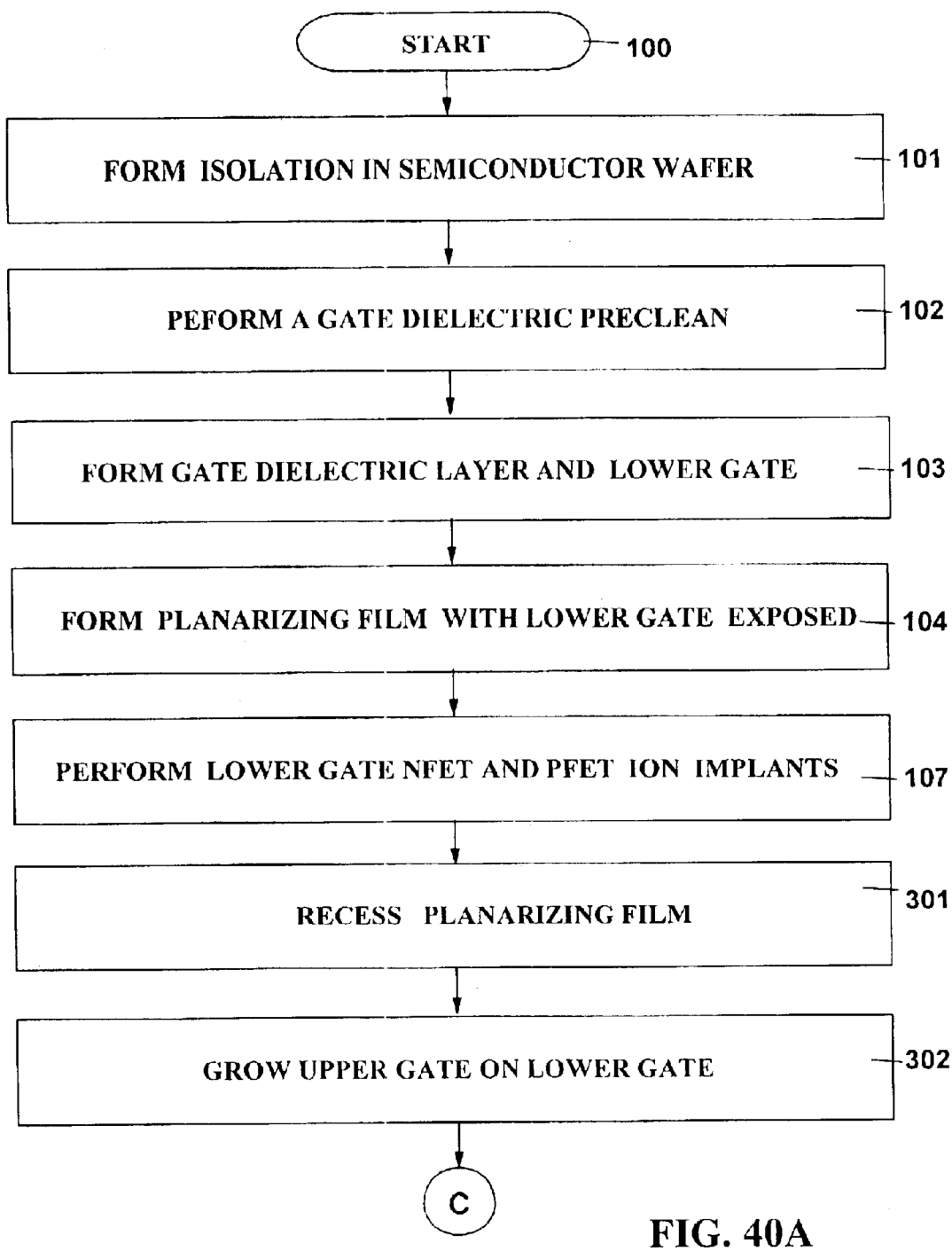
Figure 40B:
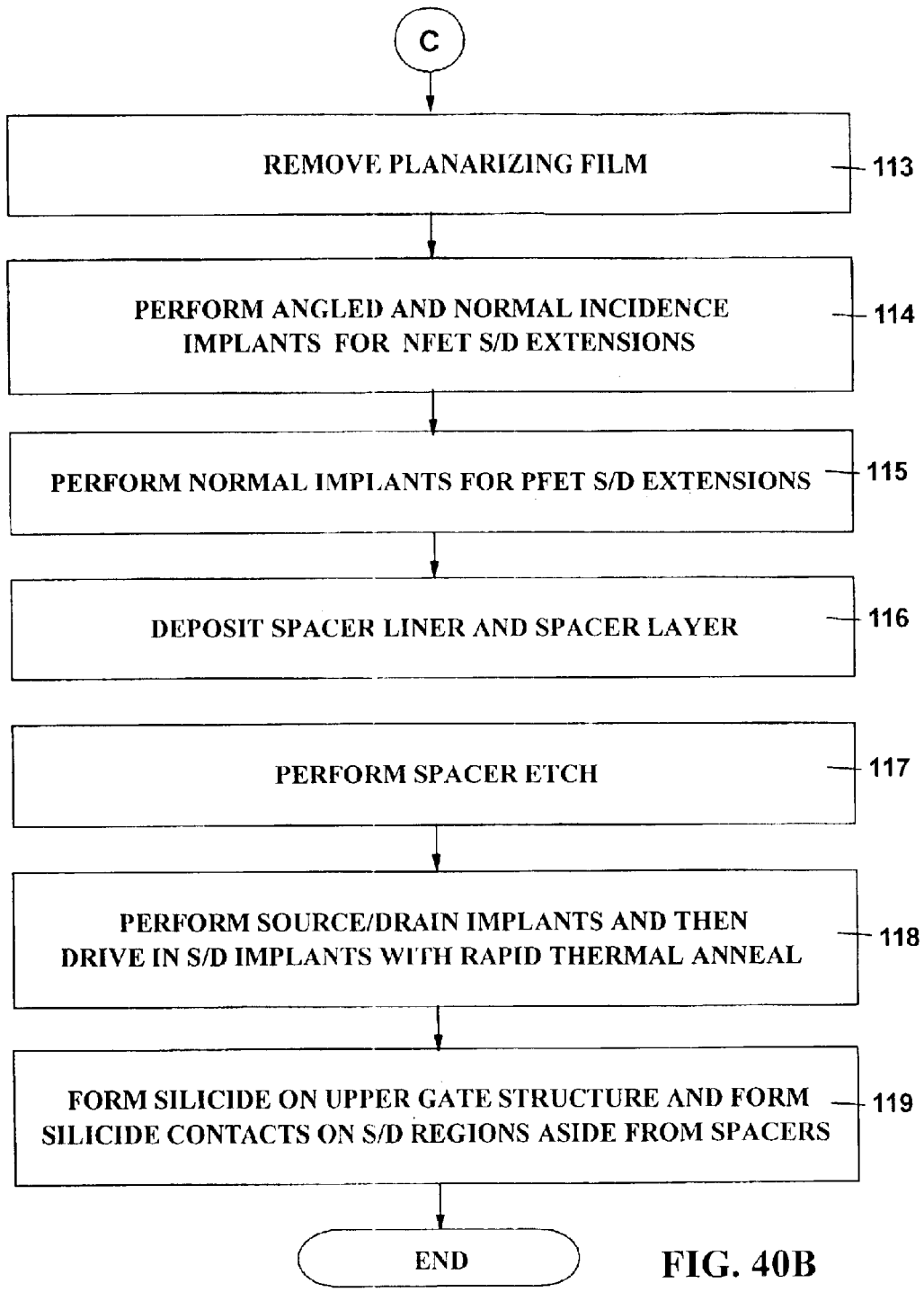

FIGS. 28–39 show a device being manufactured by a third sequence of process steps in accordance with this invention for forming a device with the process flow being shown in FIGS. 40A–40B.

The process is modified from the First Embodiment but the first four steps shown in FIGS. 15–18 are identical to the process steps in FIGS. 1–4 as shown by the process steps 101, 102, 103 104, described above, in FIG. 27A However, steps 108 and 105 and 106, 108 and 109 in FIG. 14A and step 112 are omitted from the second embodiment and steps 301 and 302 are substituted therefor.

Recess the Planarizing Film

Figure 32:
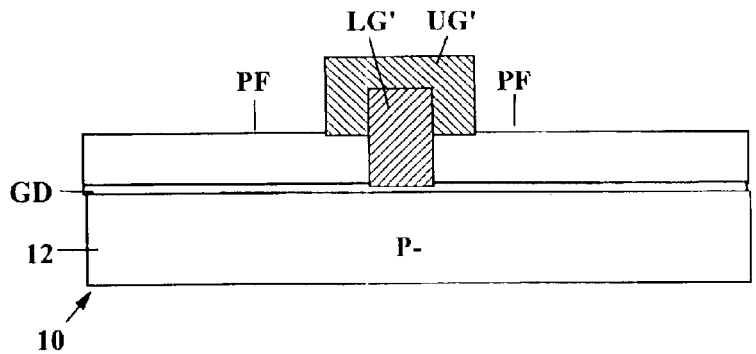

After step 104 in FIG. 42A, the planarized film PF is partially recessed exposing upper portions of the sidewalls of the lower gate LG' as shown in FIG. 32. The process employed to recess the planarized film PF is to use hydrofluoric acid or $CH_3$ and $CF_4$.

Grow Upper Gate Over Lower Gate

Figure 33:
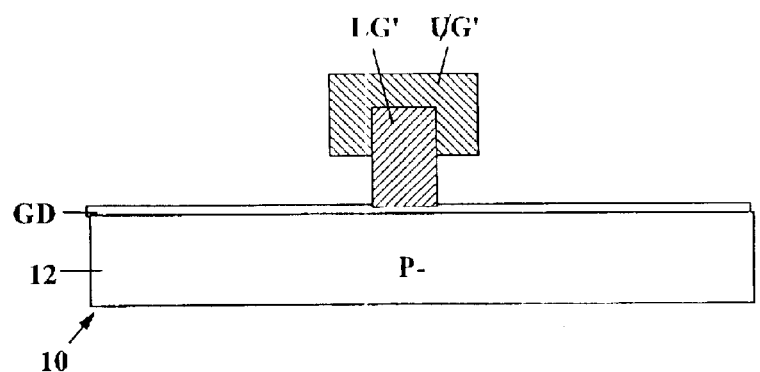
Figure 34:
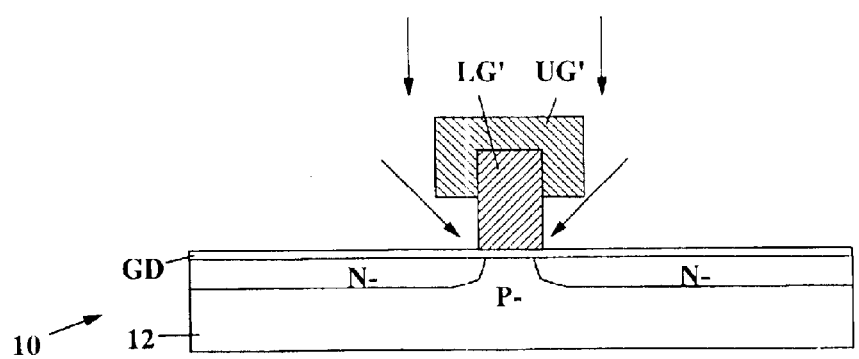
Figure 35:
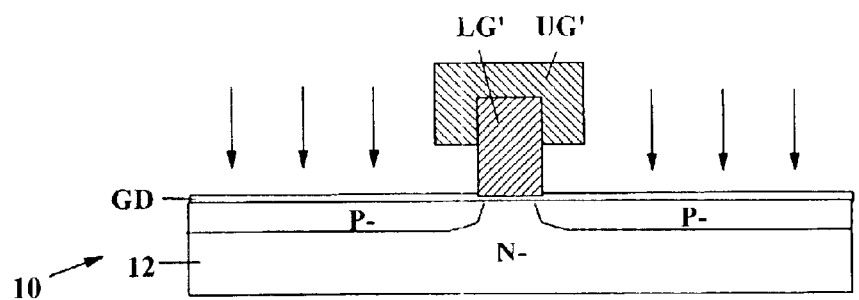
Figure 36:
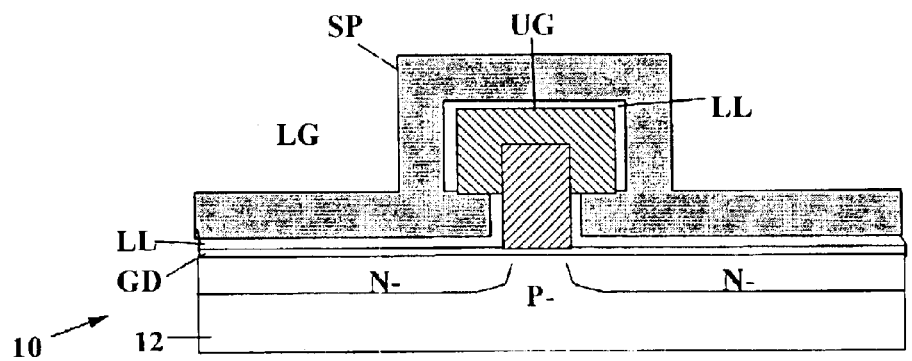
Figure 37:
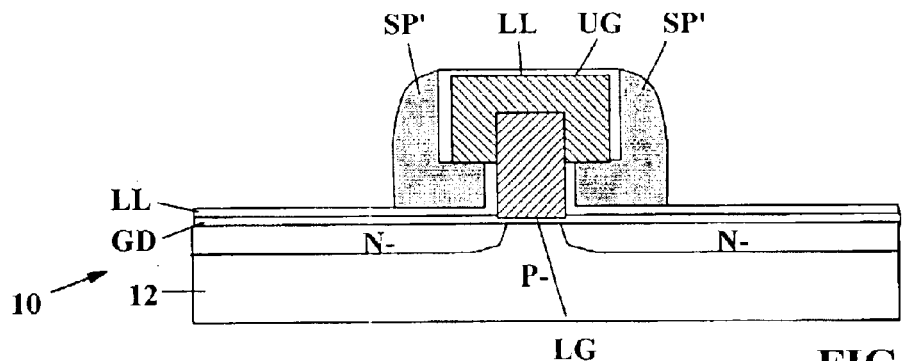
Figure 38:
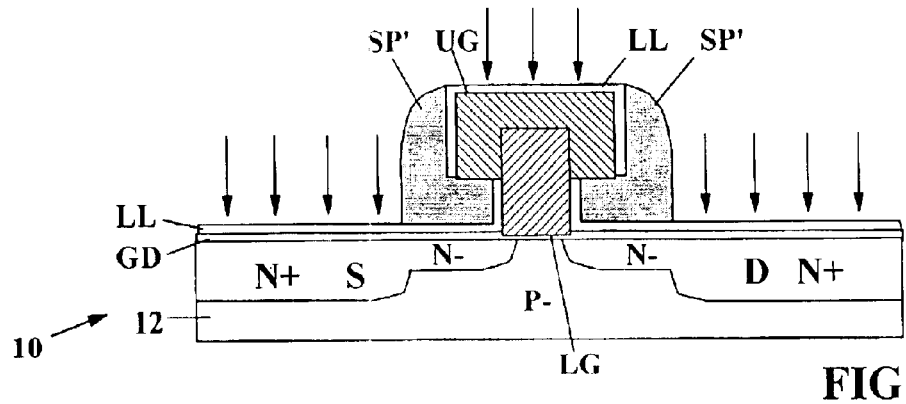
Figure 39:
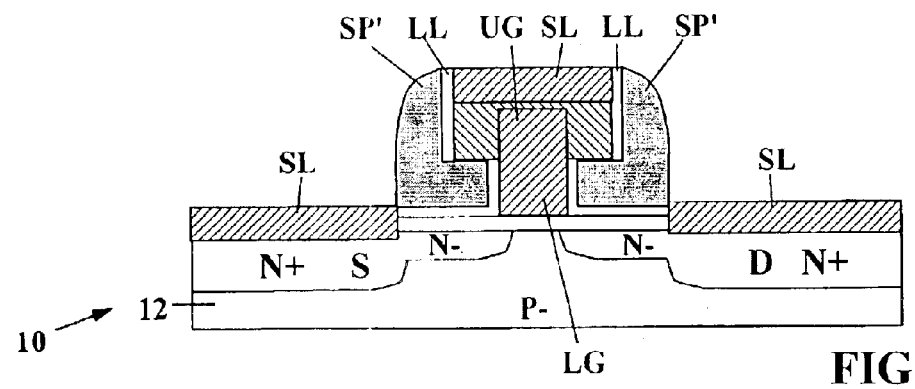

After step 301, step 302 is performed which involves growing the upper gate UG' composed of Si or W is selectively over the exposed top surface and upper sidewalls of the lower gate LG' as shown in FIG. 33. The growing process used in step 302 is the same as in step 208 above in the second embodiment of the invention.

Then steps 113–119 arm performed in that sequence as shown in FIGS. 33–39 which completes the third embodiment of this invention to complete formation of the device 10.

One purpose of this invention is to provide a MOS transistor with improved gate activation characteristics. Another purpose of this invention is to provide a MOS transistor with reduced line resistance. An additional purpose of this invention is to provide a MOS transistor with improved source/drain extension characteristics.

The new device allows for improved gate activation by gate thinning while decoupling S/D implants from the gate implant. The gate thinning enables a lower energy gate implant to be used. The lower energy implant has less energy spread which allows a higher dose to be implanted closer to the bottom portion of the gate where gate depletion takes place. The device produced by the process of this invention has a larger area for silicidation which reduces line resistance. S/D extension resistance is improved for the new device by enabling multiple angled implants.

There is an advantage to forming the implants after the T has been formed which is central to the invention.

The slant angle/normal angle incidence implants for the NFET result in improved series resistance, the extension is lower resistance, and the short channel effect is not degraded. A standard process would use an angled implant only. In this case, the maximum dose is limited by the short channel effect control, if the dopants on either side of the gate get too close then the device is no good. So, if a low dose implant is used to implant under the T, angled, and a higher dose is used to implant at normal incidence with the T serving as an offset spacer, then a low resistance extension with good short channel effect control is achieved. One additional advantage is that the NFET can have a double extension implant one with offset, and the other one at an angle, with out the T offset using only on lithography step. A PFET requires an offset spacer for extension implant due to the higher diffusivity of boron, which is used for the PFET extension. This double slant angle/normal angle NFET implant procedure improves upon standard process flows since a lower resistance NFET extension with good short channel effect control is achieved using one mask step.

Resolution of Problems with Short Channel Effect

The problem solved by this invention is formation of a low resistance extension and still maintain good short channel effect control.

Low resistance junctions can be achieved by high dose implant, but high dose implant can degrade short channel effect.

The more dose that is implanted into the Si, the more diffusion occurs for a given thermal cycle. Therefore, for a given ion implant energy and anneal, the higher dose implant will always diffuse more; but more diffusion causes a degraded short channel effect.

If there is an excessive dose or an excessively high energy of ion implantation or too high a temperature in the thermal cycling, the dopants will diffuse too far under the gate into the channel region causing the channel region to be shortened. Eventually, the diffusion on either side of the gate can connect and the device cannot turn off. This would be the worse case scenario of poor short channel control.

The problem of forming a low resistance extension while still maintaining good short channel effect control can be overcome by using the top portion of the T to act as an implant offset. The wider the top of the T, the farther away the implant will be offset from the edge of the gate. In this way, a high dose implant can be performed at a normal incidence to form the low resistance part of the extension. However, as the dopants diffuse, the concentration (atoms/$cm^3$) becomes lower and the resistance at the end of the diffusion region can have a higher resistance.

Thus, the angled implant can be performed with a much lower dose than the normal incidence implant and be implanted into the area which will become low in concentration if only the high dose normal incidence implant were used.

The combination of using the T to offset the high dose implant and also using an angled implant to get under the T, can be used to create an extension with low resistance and good short channel effect control.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

What is claimed is:

1. A method of forming a semiconductor transistor device, comprising the steps of:

providing a semiconductor substrate with a gate dielectric layer thereover and a lower gate electrode structure formed over the gate dielectric layer with the lower gate electrode structure having a lower gate top;

forming a planarizing layer over the gate dielectric layer leaving the gate top of the lower gate electrode structure exposed;

forming an upper gate structure over the lower gate electrode structure to form a T-shaped gate electrode with an exposed lower surface of the upper gate surface and exposed vertical sidewalls of the gate electrode;

removing the planarizing layer;

forming source/drain extensions in the substrate protected from the short channel effect;

forming sidewall spacers adjacent to the exposed lower surface of the upper gate and the exposed vertical sidewalls of the T-shaped gate electrode;

forming source/drain regions in the substrate; and forming silicide layers on top of the T-shaped gate electrode and above the source/drain regions.

2. The method of claim 1 including the steps of:

recessing the lower gate structure to form a recessed lower gate within the planarizing layer before forming the upper gate;

etching the planarizing layer to define a wide recess therein having a width greater than the width of the lower gate electrode structure; and then forming the upper gate within the wide recess on the recessed lower gate whereby the lower gate electrode structure and upper gate structure form the T-shaped gate electrode.

3. The method of claim 2 including the step of forming the sidewall spacers of silicon nitride on the exposed lower surface of the upper gate and on the vertical sidewalls of the T-shaped gate electrode.

4. The method of claim 2 including the steps of:

forming NFET extensions by a combination of a vertical angle ion implant of dopant ions and a tilted angle ion implant of dopant ions, and forming PFET extensions by a vertical angle ion implant of dopant ions.

5. The method of claim 2 including the steps of:

forming NFET extensions by a combination of a vertical angle ion implant of arsenic ions and a tilted angle ion implant of arsenic ions, and forming PFET extensions by only a vertical angle ion implant of boron ions.

6. The method of claim 2 including the steps of:

forming the sidewall spacers of silicon nitride on the exposed lower surface of the upper gate and on the vertical sidewalls of the T-shaped gate electrode, forming NFET extensions by a combination of a vertical angle ion implant of dopant ions and a tilted angle ion implant of dopant ions, and forming PFET extensions by a vertical angle ion implant of dopant ions.

7. The method of claim 2 including the steps of:

forming the sidewall spacers of silicon nitride on the exposed lower surface of the upper gate and on the vertical sidewalls of the T-shaped gate electrode, forming the sidewall spacers of silicon nitride on the exposed lower surface of the upper gate and on the vertical sidewalls of the T-shaped gate electrode, forming NFET extensions by a combination of a vertical angle ion implant of dopant ions and a tilted angle ion implant of dopant ions, and forming PFET extensions by a vertical angle ion implant of dopant ions.

8. The method of claim 1 including the steps of:

recessing the lower gate structure to form a recessed lower gate within the planarizing layer before forming the upper gate;

then growing the upper gate on the surface of the lower gate within the recess and overgrowing the upper gate above the planarizing layer whereby the lower gate electrode structure and upper gate structure form the T-shaped gate electrode.

9. The method of claim 8 including the step of forming the sidewall spacers of silicon nitride on the exposed lower surface of the upper gate and on the vertical sidewalls of the T-shaped gate electrode.

10. The method of claim 8 including the steps of:

forming NFET extensions by a combination of a vertical angle ion implant of dopant ions and a tilted angle ion implant of dopant ions, and forming PFET extensions by a vertical angle ion implant of dopant ions.

11. The method of claim 8 including the steps of:

forming NFET extensions by a combination of a vertical angle ion implant of arsenic ions and a tilted angle ion implant of arsenic ions, and forming PFET extensions by only a vertical angle ion implant of boron ions.

12. The method of claim 8 including the steps of:

forming the sidewall spacers of silicon nitride on the exposed lower surface of the upper gate and on the vertical sidewalls of the T-shaped gate electrode, forming NFET extensions by a combination of a vertical angle ion implant of dopant ions and a tilted angle ion implant of dopant ions, and forming PFET extensions by a vertical angle ion implant of dopant ions.

13. The method of claim 8 including the steps of:

forming the sidewall spacers of silicon nitride on the exposed lower surface of the upper gate and on the vertical sidewalls of the T-shaped gate electrode, forming the sidewall spacers of silicon nitride on the exposed lower surface of the upper gate and on the vertical sidewalls of the T-shaped gate electrode, forming NFET extensions by a combination of a vertical angle ion implant of dopant ions and a tilted angle ion implant of dopant ions, and forming PFET extensions by a vertical angle ion implant of dopant ions.

14. The method of claim 1 including the steps of:

partially recessing the planarizing layer below the level of the lower gate top before forming the upper gate;

then selectively growing the upper gate on exposed surfaces of the lower gate top to form the T-shaped gate electrode.

15. The method of claim 14 including the step of forming the sidewall spacers of silicon nitride on the exposed lower surface of the upper gate and on the vertical sidewalls of the T-shaped gate electrode.

16. The method of claim 14 including the steps of:

forming NFET extensions by a combination of a vertical angle ion implant of dopant ions and a tilted angle ion implant of dopant ions, and forming PFET extensions by a vertical angle ion implant of dopant ions.

17. The method of claim 14 including the steps of:

forming NFET extensions by a combination of a vertical angle ion implant of arsenic ions and a tilted angle ion implant of arsenic ions, and forming PFET extensions by only a vertical angle ion implant of boron ions.

18. The method of claim 14 including the steps of:

forming NFET extensions by a combination of a vertical angle ion implant of arsenic ions and a tilted angle ion implant of arsenic ions, and forming PFET extensions by only a vertical angle ion implant of boron ions.

19. The method of claim 14 including the steps of:

forming the sidewall spacers of silicon nitride on the exposed lower surface of the upper gate and on the vertical sidewalls of the T-shaped gate electrode, forming NFET extensions by a combination of a vertical angle ion implant of dopant ions and a tilted angle ion implant of dopant ions, and forming PFET extensions by a vertical angle ion implant of dopant ions.

20. The method of claim 14 including the steps of:

forming the sidewall spacers of silicon nitride on the exposed lower surface of the upper gate and on the vertical sidewalls of the T-shaped gate electrode, forming NFET extensions by a combination of a vertical angle ion implant of dopant ions and a tilted angle ion implant of dopant ions, and forming PFET extensions by a vertical angle ion implant of dopant ions.

* * * * *